United States Patent
Takahashi

(10) Patent No.: US 6,657,725 B1
(45) Date of Patent: *Dec. 2, 2003

(54) SCANNING TYPE PROJECTION EXPOSURE APPARATUS AND DEVICE PRODUCTION METHOD USING THE SAME

(75) Inventor: Kazuhiro Takahashi, Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,836

(22) Filed: May 25, 1999

(30) Foreign Application Priority Data

Jun. 4, 1998 (JP) ............................ 10-172159

(51) Int. Cl.[7] ................................ G01B 11/00
(52) U.S. Cl. ...................... 356/400; 356/401
(58) Field of Search .................. 356/401, 399–400; 355/53

(56) References Cited

U.S. PATENT DOCUMENTS 5,895,737 A * 4/1999 McCullough et al. ......... 430/30
5,966,202 A * 10/1999 McCullough ................. 355/67

FOREIGN PATENT DOCUMENTS

JP 7-37774 2/1995
JP 62-193125 8/1997

* cited by examiner

Primary Examiner—Frank G. Font
Assistant Examiner—Philip Natividad
(74) Attorney, Agent, or Firm—Fitzpatrick, Cella, Harper & Scinto

(57) ABSTRACT

A scanning type projection exposure apparatus including an illumination optical system having a slit which can change an illumination area width in the scanning direction, excluding a portion of this area. The light intensity at a portion located in correspondence with a slit area is detected, and the detection result is used to control the exposure amount with respect to a wafer. The scanning type projection exposure apparatus can control the exposure amount precisely. In the exposure apparatus, the illumination area width in the scanning direction can be changed in order to make uniform the exposure amount in a direction perpendicular to the scanning direction.

16 Claims, 4 Drawing Sheets

SCANNING TYPE PROJECTION EXPOSURE APPARATUS AND DEVICE PRODUCTION METHOD USING THE SAME

BACKGROUND OF THE INVENTION

1. Field of the Invention

The present invention relates to a scanning type projection exposure apparatus and a device production method using the same. Scanning type projection exposure apparatuses are used in the lithography step carried out to produce, for example, semiconductor devices (including an integrated circuit (IC) or a large scale integrated (LSI) circuit), or image pickup devices (such as charge-coupled devices (CCD)), or display devices (such as liquid crystal panels), or magnetic heads. They are suitable for projecting a pattern on a reticle (mask) onto a wafer by a projection optical system with a uniform exposure amount.

2. Description of the Related Art

In recent years, semiconductor devices, including an integrated circuit (IC) or a large scale integrated (LSI) circuit, have rapidly become increasingly integrated. This has resulted in the production of various types of projection exposure apparatuses which are important devices when micromachining semiconductor wafers. They include 1× magnification projection exposure apparatuses (mirror projection aligners), and reduction projection exposure apparatuses (steppers). In mirror projection aligners, a photosensitive substrate or a wafer (coated with a photosensitive agent), and mask (with a circuit pattern) are exposed by scanning them, using a 1× mirror optical system (with a circular exposure area). In reduction projection exposure apparatuses, an image of a pattern of a mask (reticle) is formed on a wafer by a refractive optical system, and the wafer is exposed by the step-and-repeat method.

In recent years, there has been a trend towards forming larger chip patterns on one semiconductor device. This has given rise to the demand for projection exposure apparatuses which can project a larger area pattern of a mask onto a wafer by exposure.

To respond to this demand, various types of scanning type reduction projection exposure apparatuses which utilize the step-and-scan method have been proposed. They are capable of providing high resolution and allow larger screen sizes to be used. In these exposure apparatuses, a pattern of a reticle is illuminated by light beams which have been passed through slits. The illuminated pattern is projected onto a wafer by exposure as a result of scanning operations performed through a reduction projection optical system.

The various types of scanning type reduction projection exposure apparatuses proposed include the following two types. In one type, which is an improvement over the 1× magnification scanning type exposure apparatus comprising a reflective projection optical system, a refractive element is incorporated in the projection optical system, and combined with a reflective element. In the other type, a reduction projection optical system which comprises only a refractive element is used in order to scan a mask stage and a wafer stage in synchronism with each other at the velocity ratio based on the reduction magnification.

In general, in order to obtain a high resolution pattern, it is necessary to uniformly expose a wafer with light.

A method of adjusting the amount of light exposure to a uniform amount with respect to a wafer (which is irradiated) in a 1× scanning type projection exposure apparatus is disclosed in, for example, Japanese Patent Laid-Open No. 62-193125. In the disclosed method, when the illuminance at the coordinates in a direction perpendicular to the scanning direction is high, the irradiation range (or illumination area) in the scanning direction is narrowed. On the other hand, when the illuminance at these coordinates is low, the irradiation range is widened. By adjusting the irradiation range in the above-described way, scanning and exposure operations can be performed such that the integration light amount for the coordinates in the scanning direction becomes uniform.

In scanning type projection exposure apparatuses, a portion of the light within the illuminating system is separated. Then, the light portion amount is detected by a detector, and the detection result is used so that a suitable amount of light can be supplied on a wafer surface. In this case, it becomes very important to previously determine the relationship between the illuminance at the wafer surface and the amount of light entering the detector, and to precisely monitor the illuminance at the wafer surface, from the amount of light entering the detector.

However, in scanning type projection exposure apparatuses, the exposure amount at each point on the wafer surface depends on the integration light amount in the scanning direction. Therefore, when, in order to adjust the exposure amount in the non-scanning direction to make it uniform, width adjustments in the scanning direction are carried out for every location in the non-scanning direction, and changes occur in the illumination area width in the scanning direction at a location where the amount of light falling thereupon has been measured by a detector, and the relationship between the measured amount of light and the integration light amount, falling on the wafer surface, changes. Consequently, the exposure amount cannot be controlled precisely.

SUMMARY OF THE INVENTION

Accordingly, it is an object of the present invention to provide a scanning type projection exposure apparatus which can control the exposure amount precisely. In the scanning type projection exposure apparatus, an illumination area width in the scanning direction can be changed in order to make uniform the exposure amount in a direction perpendicular to the scanning direction.

To this end, according to the present invention, there is provided a scanning type projection exposure apparatus comprising:

means for holding a mask with a pattern formed thereon;

means for holding a wafer, onto which the pattern on the mask is transferred;

wherein while the mask and the wafer are being scanned by means of the mask holding means and the wafer holding means, the pattern is illuminated such that an illumination area narrower than the pattern is successively illuminated in order to transfer the pattern onto the wafer;

an illumination optical system for illuminating the mask, the illumination optical system comprising a slit for determining the width of the illumination area in the scanning direction, the slit having an area whose width does not change in the scanning direction, the slit being provided for changing the width in the scanning direction of the illumination area, excluding the area whose width does not change;

a first light detector for extracting a portion of the light of the illumination optical system in order to detect the intensity of the light portion;

wherein the exposure amount with respect to the wafer is controlled based on an output of the first light detector; and wherein the first light detector detects the intensity of the light at a position located in correspondence with the area whose width does not change.

DESCRIPTION OF THE PREFERRED EMBODIMENTS

Figure 1:
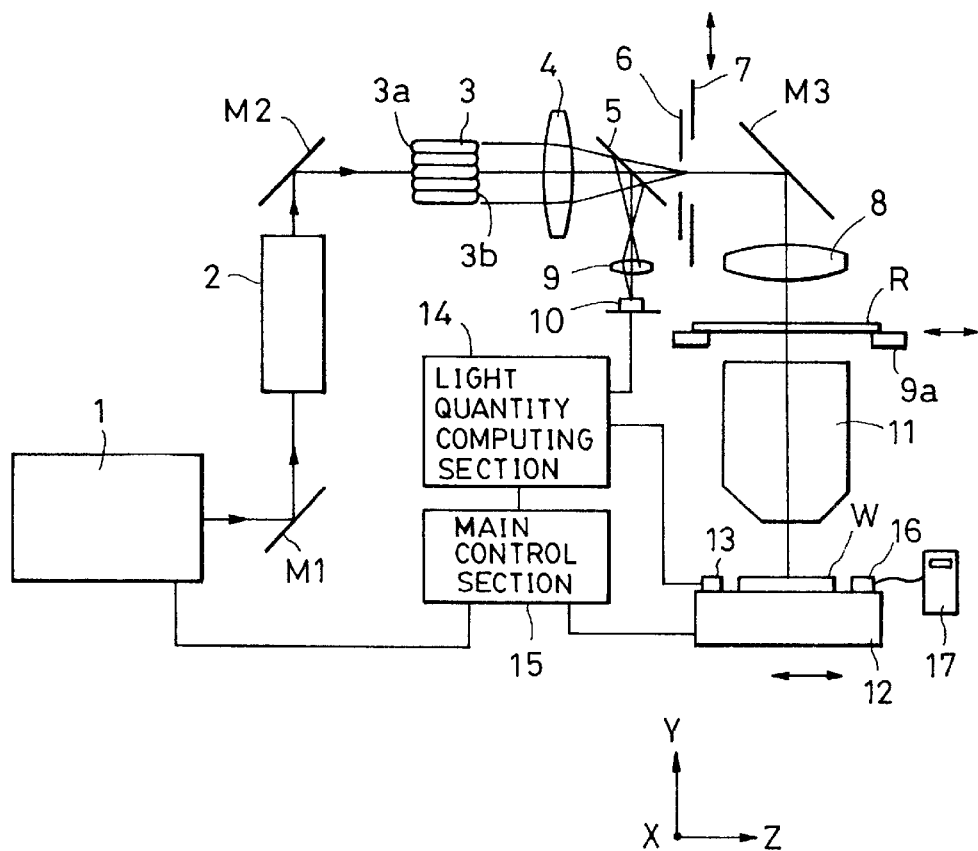
FIG. 1 is a schematic view of the structure of an embodiment of the scanning type projection exposure apparatus in accordance with the present invention.

FIG. 1 is a schematic view of the structure of a first embodiment of the scanning type exposure apparatus in accordance with the present invention. The exposure apparatus of the first embodiment is a step-and-scan type exposure apparatus, in which a reticle (or mask), with, for example, a circuit pattern formed thereon, is irradiated with light beams from a light source through an illumination optical system. Through a projection lens (projection optical system), a wafer, coated with a photosensitive material, is scanned in order to project and print the pattern reduced in size onto the wafer. This type of exposure apparatus is suitable for use in producing semiconductor devices (including integrated circuits (IC), large scale integrated (LSI) circuits, or the like), image pick-up devices (such as charge-coupled devices), magnetic heads, or the like.

In FIG. 1, reference numeral denotes 1 denotes a light source, such as a pulsed laser (including, for example, an excimer laser), which supplies pulsed light beams. Symbol Ml denotes a mirror which changes the light path of the light beams from the light source 1. Reference numeral 2 denotes a beam shaping optical system which converts the light beams from the light source 1 into incoherent light beams, forms them into a predetermined shape, and causes the predeterminately shaped light beams to be incident upon a light-incoming surface 3a of an optical integrator 3 through a mirror M2. The optical integrator 3 comprises, for example, a fly's eye lens system consisting of a plurality of tiny lenses, with a plurality of secondary light sources being formed near its light-outgoing surface 3b. Reference numeral 4 denotes a condenser lens which is used to subject a masking blade 7 to Koehler illumination through a half mirror 5 and a slit 6, using light beams from the secondary light sources provided near the light-outgoing surface 3b of the optical integrator 3.

The light beams, which have illuminated the masking blade 7, pass through the mirror M3 and an image-forming lens 8 to illuminate the reticle (or mask) R. The masking blade 7 limits the size of the illumination area of the reticle R surface. The masking blade 7 and the reticle R are disposed conjugationally with respect to each other. The slit 6 is disposed towards the optical axis by a predetermined distance from the masking blade 7. The slit 6 comprises two sets of light-shielding plates which shield it from light beams coming in from a direction perpendicular to the optical axis.

Figure 4:
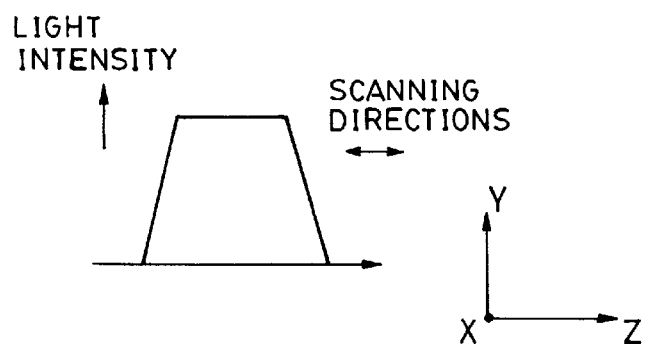
FIG. 4 illustrates the light intensity distribution in the scanning direction of light passing through the slit 6 of FIG. 2.

The masking blade 7 has an opening formed by four shielding plates which move independently of one another. The image of the opening is projected onto the reticle R through the image-forming lens 8. The image of the slit 6 is also projected onto the reticle R through the image-forming lens 8. Since the slit 6 is slightly separated optically from the position of conjugation with respect to the reticle R, the light intensity distribution on the reticle R caused by the slit 6, whose image is slightly defocused, becomes trapezoidal in shape, as shown in FIG. 4.

Reference numeral 10 denotes an illuminance monitor (detector) serving as a first light detector. A portion of the illumination (exposure) light separated by the half mirror 5 is gathered and concentrated by the lens 9. The detector 10 detects the amount of the concentrated light and outputs a detection signal to a light amount computing section 14. The lens 9 and the illumination monitor 10 are component parts of an exposure amount controlling means.

The reticle R is held by a reticle stage (or mask holding means) Ra, with a circuit pattern being formed on the reticle. Reference numeral 11 denotes a projection lens (projection optical system) which projects the reticle's circuit pattern reduced in size onto a wafer W. The wafer W is coated with a resist, being a photosensitive material, and is placed on a wafer stage (or wafer holding means) which can be displaced three dimensionally.

The reticle stage Ra and the wafer stage 12 are moved in order to move the wafer W and the reticle R in the scanning directions, represented by the double-headed arrows, and at a constant velocity in synchronism with each other at a velocity ratio corresponding to the projection magnification of the projection lens 11, whereby scanning and exposure operations are carried out.

An illuminance monitor (illuminance meter) 13 serving as a second light detector is provided on the wafer stage 12 in order to measure the actual illuminance of the wafer W through the projection lens 11.

In order to supply the proper amount of exposure light to the wafer W based on the amount of light measured by the illuminance monitor 10 and the signal from the illuminance meter 13, the light amount computing section 14 computes the timing of generation of the next pulse and the target light amount.

Reference numeral 15 denotes a main control section which controls, for example, the scanning velocity of the reticle stage Ra and the wafer stage 12, the timing of generation of a pulse from the light source 1, or the pulse output, based on the signal from the light amount computing section 14. The main control section 15 comprises in its interior a storage means for storing information regarding the relationship between the output from the detector 10 and the output from the illuminance meter 13.

Reference numeral 16 denotes an absolute illuminace meter for measuring absolute illuminance, which is provided on the stage 12. The meter 16, which is usually not mounted on the stage 12, is mounted for calibrating the illuminance meter 13 and the illuminance monitor 10. Reference numeral 17 denotes an indicator of the absolute illuminance meter 16.

Figure 2:
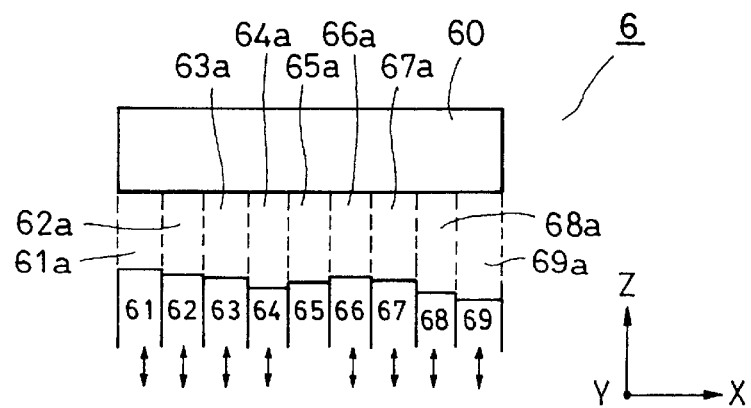
FIG. 2 is a structural view of the slit 6.

FIG. 2 is a schematic view of the slit 6 which is used to change the width of the irradiation range (illumination area), excluding a portion of this range (or area), of the surface of the reticle R or the wafer W in the scanning direction. The slit 6 comprises a stationary light-shielding plate 60 and a plurality of separately formed light-shielding plates 61 to 69. The light-shielding plates 61 to 64 and 66 to 69 can be driven in the dimension represented by arrow Z (or in a dimension perpendicular to the scanning dimension).

In the embodiment, the eight light-shielding plates 61, 62, 63, 64, 66, 67, 68, and 69, disposed in the dimension represented by arrow X (or the scanning dimension), are pushed or pulled by, for example, a ball screw (not shown) in order to change their distances from the light-shielding plate 60. This causes the width of the exposure range in the scanning direction to be changed through areas 61a to 64a and 66a to 69a extending in a direction perpendicular to the scanning direction. Area 65a of the light-shielding plate 65 is positioned at the center of the opening in the slit 6 and at the optical axis. The light-shielding plate 65 is fixed such that the width of the area 65a in the Y dimension, or the scanning dimension, is kept constant.

By changing the distance (or width) between the light-shielding plate 60 and the light-shielding plates 61 to 64 and 66 to 69, the irradiation range width in the scanning dimension is changed through the areas 61a to 64a and 66a to 69a, extending in a direction perpendicular to the scanning direction, whereby the integration light exposure amount in the scanning direction is set such that it becomes uniform in a direction perpendicular to the scanning direction.

Figure 3:
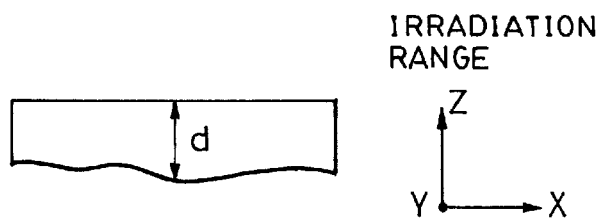
FIG. 3 illustrates an irradiation range of a surface to be illuminated by light passing through the slit 6 of FIG. 2.

FIG. 3 illustrates the shape of the illumination range, limited in size by the slit 6, of the irradiation surface (of the reticle R or of the wafer W). As mentioned above, as regards the Y direction, the light intensity distribution curve forms a trapezoid. In the X direction, the irradiation area is limited by shielding an X direction end of the masking blade 7 from light by a light-shielding plate. In other words, the X-direction light-shielding plate of the masking blade 7 is disposed at a location which guarantees the provision of a maximum effective illumination area in order to determine the length of the illumination area in the X direction. On the other hand, the Y-direction light-shielding plates of the masking blade 7 form an opening which is larger than the opening in the slit 6. The actual illumination area width in the Y direction is determined by the slit 6.

Figure 5:
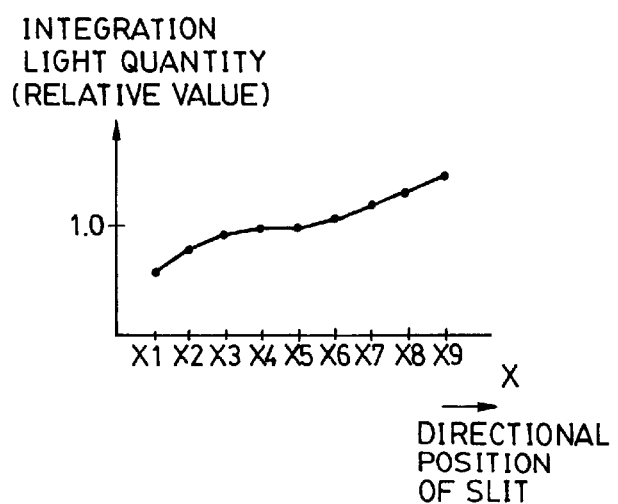
FIG. 5 illustrates the integration light amount measured with an illuminance meter.

In order to adjust the light exposure amount in a direction perpendicular to the scanning direction by the slit 6 to make it uniform, the light amount values for the X coordinates of the light intensity distribution curve of FIG. 3 are integrated for the Z direction in order to measure the integration light amount by the illuminance meter 13. The measurement results are shown in FIG. 5. The graph of FIG. 5 is a plot of the X coordinates on the wafer W surface (indicated along the horizontal axis) versus the measurement results (indicated along the vertical axis). The measurement value at the X5 position is defined as 1. In this case, the illumination area width is adjusted as follows. For points (X1 and X2) where the integration light amount is lower than the integration light amount at position X5, the widths of the slit areas located in correspondence with the points X1 and X2, that is, the distances between the light-shielding plate 60 and the light-shielding plate 61 and between light-shielding plate 60 and the light-shielding plate 62 of FIG. 2 are increased. On the other hand, for points (X7, X8, and X9) where the integration light amount is higher than the integration light amount at position X5, the widths of the slit areas located in correspondence with the points X7, X8, and X9, that is, the distance between the light-shielding plates 60 and 67, the distance between the light-shielding plates 60 and 68, and the distance between the light-shielding plates 60 and 69 of FIG. 2 are made smaller.

Figure 6:
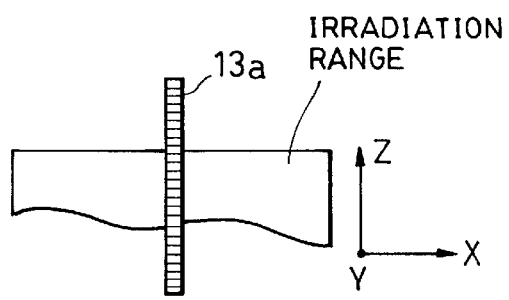
FIG. 6 illustrates the relationship between an irradiation range and a light-receiving portion of a linear sensor used as an illuminance meter.
Figure 7:
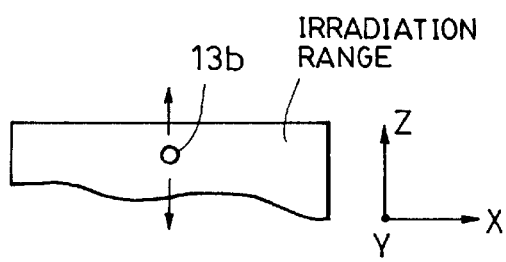
FIG. 7 illustrates the relationship between a pin-hole shaped light-receiving portion of a sensor and an irradiation range.

Methods for measuring the integration light amount include the following two types. In the first type, a one-dimensional linear sensor 13a, shown in FIG. 6, which has a receiving surface that is longer than the illumination area in the Z direction is used in order to measure the total amount of light incident upon each location of the light-receiving surface. In the second type, a sensor 13 with a pin-hole shaped receiving portion, shown in FIG. 7, is moved in the Z direction in order to measure the illuminance values, which are added up to obtain the integration light amount.

A description will now be given of the method of calibrating the detector 10 and the illuminance meter 13 in order to determine the relationship between the light exposure amount of the wafer W (when the wafer W is actually being scanned and exposed to project a pattern thereon) and the target value of the detector (illuminance monitor) 10 of the projection exposure apparatus of FIG. 1. In the description, the linear sensor 13a of FIG. 6 is taken as an example of the illuminance meter. In the steps to be described, the reticle R is moved onto and away from the light path by a driving means (not shown).

The absolute illuminance meter 16 is mounted to the stage 12 and moved to the optical axis. The light source 1 is made to emit light. From the output of the detector 10 and the value on the indicator 17 of the absolute illuminance meter 16, the relationship between the output (that is, the output voltage or the value obtained by analog-to-digital conversion) from the detector 10 and the actual illuminance of the wafer W surface is determined in order to predict the absolute illuminance of the wafer W surface from the output of the detector 10. It is preferable that the detector 10 be disposed at the light paths of the separated light portion so as to be positioned virtually conjugationally with the wafer W surface.

Then, the absolute illuminance meter 16 is removed, and the stage 12 is driven to move the illuminance meter 13 to the optical axis. The light source 1 is made to emit light, and the output values of the illuminance meter 13 and the detector 10 are measured. When the linear sensor 13a is used, after previously correcting each bit (light receiving element) sensitivity in the sensor 13a, the relationship between the reference bit output value in the sensor 13a and the output detector 10 is determined, making it possible to determine the absolute illuminance for every bit in the linear sensor 13a, based on the output of the linear sensor 13a.

Figure 8:
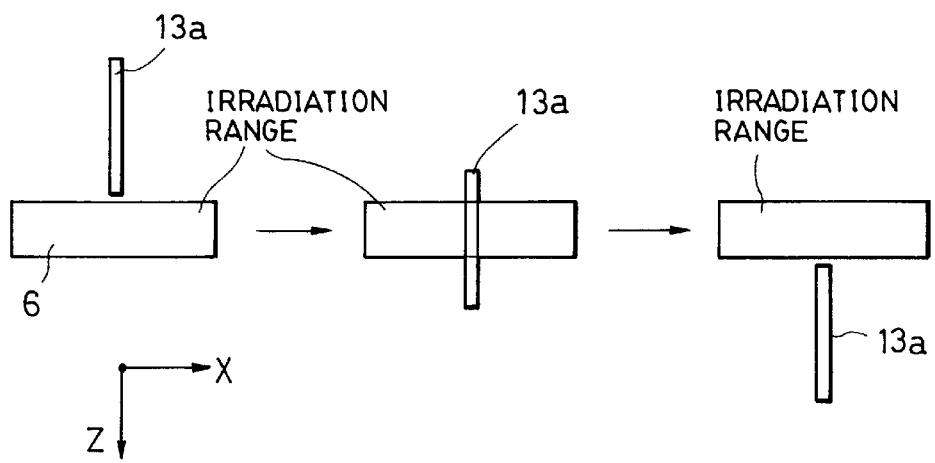
FIG. 8 illustrates the movement of the sensor, used to determine the relationship between the illuminance measured at the director 10 and the exposure amount measured at the illuminance meter 13.

FIG. 8 illustrates the movement of the illuminance meter 13 when determining the relationship between the output of the detector 10 and the exposure amount with respect to the wafer W surface when it is being scanned and exposed. As shown in FIG. 8, the linear sensor 13a is scanned at an area corresponding to the area 65a (of the slit 6) whose width is fixed in the scanning direction.

In the embodiment, the portion of the illumination area whose width in the scanning direction is fixed is defined as the center of the illumination area in the longitudinal direction thereof. The illuminance meter 13 is driven so as to pass the optical axis of the projection optical system 11.

By a command given by the main control section 15, the stage 12 is scanned at a reference velocity V0 with respect to the stage 12, and, at the same time, the light source 1 is made to generate light with constant energy at an oscillation frequency f0. The detector 10 is used to measure the illuminance with every generated pulse, and the illuminance meter 13 is used to measure the integration light amount for every bit in the linear sensor 13a.

From the results, the relationship between the output of the detector 10 and the integration light exposure amount with respect to the photosensitive substrate W is determined by the following Formula (1):

$$E0 = I0 \times f0 \times d / V0 \qquad (1)$$

where the average illuminance of the illuminance values calculated at the detector 10 for all of the generated pulses is defined as I0 (mJ/cm²/Pls); the integration light exposure amount obtained by averaging the bit integration illuminance values obtained in the linear sensor 13a is defined as E0 (mJ/cm²), and the width of the portion of the irradiation range on the photosensitive substrate W that does not change is defined as d.

From Formula (1), when the set exposure amount is expressed as E (mJ/cm²) and the scanning velocity of the stage 12 is defined as V (cm/sec), the target illuminance I (mj/cm²/Pls) of the wafer W surface obtained at the detector 10 for every pulse generated, and the oscillation frequency f of the light source 1 are obtained by the following Formula (2):

$$I \times f = (E/E0) \times (V/V0) \times I0 \times f0 \qquad (2)$$

The target illuminance I (mJ/cm²/Pls) and the oscillation frequency f are set at the same time so that they satisfy Formula (2). They are calculated at the main control section 15 during the actual exposure operation. Information regarding the relationship between the output of the detector 10 and the output of the illuminance meter 13 is stored in the storing means of the main control section 15 and used during the actual exposure operation.

Methods of setting the target illuminance include the following two types. In the first method, the voltage applied to the light source is controlled in order to adjust the amount of light generated by the light source 1. In the second method, a dimming filter (not shown) or the like is inserted into the light path in order to adjust the amount of light.

Although in the embodiment an excimer laser, which emits pulsed light beams, was used as the light source 1, light sources which emit continuous light beams may also be used to determine the relationship between the output of the detector 1 and the output of the illuminance meter 13 using either one of the above-described methods. When a light source, such as a high-pressure mercury lamp, which emits continuous light beams is used, the relationship between the output of the detector 10 and the output of the illuminance meter 13 is such that the target illuminance I (mW/cm²) at the wafer W surface computed by the main control section 15 is obtained by the following Formula (3):

$$I = (E/E0) \times (V/V0) \times IA \qquad (3)$$

Here, the value measured at the detector 10 becomes the average illuminance IA (mW/cm²) at the wafer W surface, and the oscillation frequency f is not included. At least one of the brightness of the light source 1 and the transmittance of the dimming filter in the optical path is adjusted in order to set the target illuminance so as to satisfy Formula (3).

When the sensor 13b with a pin-hole shaped receiving portion, shown in FIG. 7, is used, the calibration method used for the sensor 13b is the same as that used for linear sensor 13a. However, different methods are used for determining the relationship between light exposure amount at the wafer W surface and the illuminance measured at the detector 10 for each pulse generated. When the sensor 13b is used, the integration exposure amount at only one point on the wafer W surface can be measured in one scanning operation. When the light source 1 is made to emit light under a certain condition, the light exposure amount is not controlled, so that large variations occur in the integration exposure amounts. Therefore, when the integration exposure amount is measured only once, the obtained integration exposure amount may not be accurate. To overcome this problem, a plurality of scanning operations are carried out in order to obtain the average of the integration exposure amounts measured by the sensor 13b.

According to the scanning type exposure apparatus, the width of the illumination area in the scanning direction is adjusted in order to make the light exposure amount uniform. An area whose width does not change when the width of the illumination area in the scanning direction is adjusted is provided, so that width adjustment does not cause an improper amount of exposure light to be supplied to the wafer W surface. The relationship between the amount of light to be monitored and the light amount at the wafer surface is determined by using the integration light amount in the scanning direction at the portion corresponding to the area whose width does not change. Therefore, even when the width of the other areas is adjusted in the scanning direction, the relationship between the light amount to be monitored and the light amount at the wafer surface can be maintained, whereby the proper amount of exposure light can be supplied at all times.

A description will now be given of an embodiment of the semiconductor device production method using the scanning type projection exposure apparatus described above.

Figure 9:
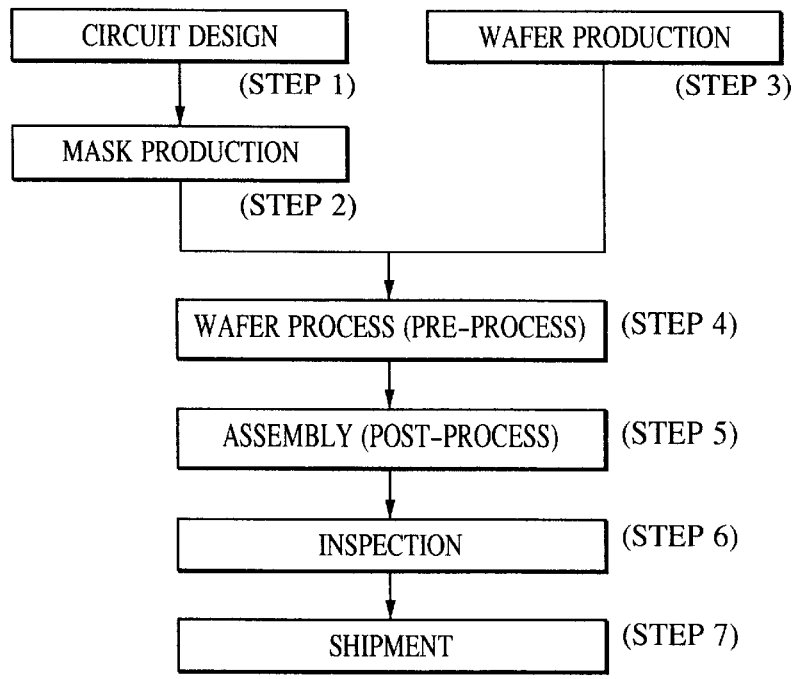
FIG. 9 is a flowchart illustrating the device production method steps of the present invention.

FIG. 9 is a flowchart illustrating the production method steps of a semiconductor device (semiconductor chip including an integrated circuit (IC) or a large-scale integrated (LCI) circuit), a liquid crystal panel, or a charge-coupled device (CCD).

In Step 1, a circuit of a semiconductor device is designed. Then, in Step 2, a mask with a circuit pattern is produced.

In Step 3, a wafer is produced using silicon or other such material. In Step 4 (the wafer process), the prepared mask and the wafer are used in order to actually form the designed circuit onto the wafer using lithography techniques.

Then, in Step 5, the wafer with the circuit formed thereon is formed into a semiconductor chip, wherein assembly (dicing, bonding), packaging (of the chip), and the like are carried out.

In Step 6, the semiconductor device prepared in Step 5 is inspected by carrying out operation confirmation and durability tests. Thereafter, in Step 7, the semiconductor device is shipped.

Figure 10:
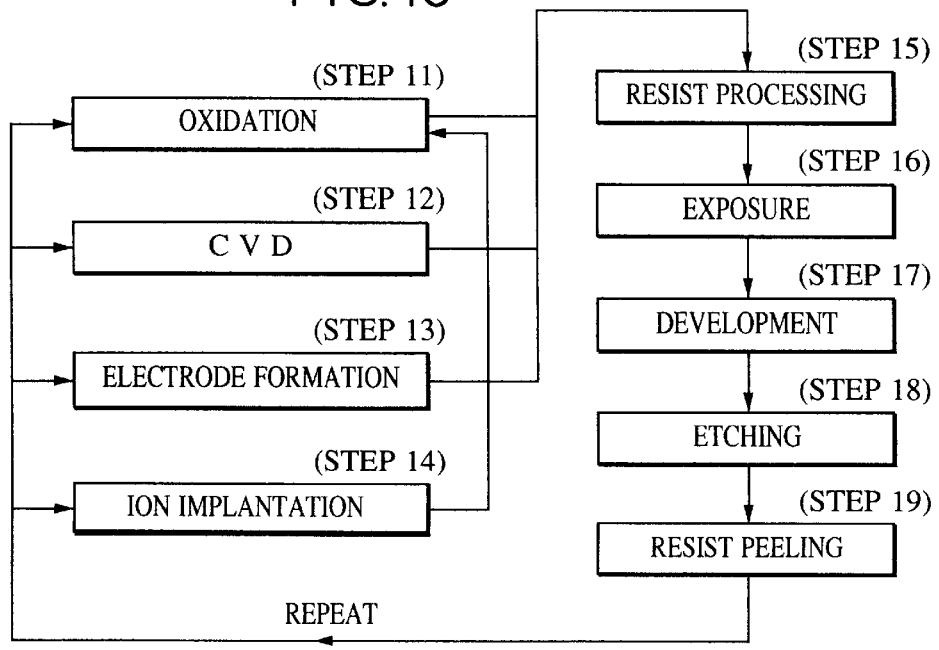
FIG. 10 is a flowchart illustrating the wafer forming process in FIG. 9.

FIG. 10 is a detailed flowchart showing the above-described wafer process in more detail. In Step 11, the surface of the wafer is oxidized. Then, in Step 12 (the chemical-vapor deposition (CVD) step), an insulation film is formed on the wafer surface.

In Step 13, an electrode is formed on the wafer by evaporation. In Step 14, ions are implanted into the wafer. In Step 15, a photosensitization agent is coated onto the wafer. In Step 16, the mask circuit pattern is printed onto the wafer by exposure using the above-described exposure apparatus.

In Step 17, the exposed portion of the wafer is developed. In Step 18, portions other than the developed resist image are etched. In Step 19, the undesired resist is removed from the wafer after etching. Multiple circuit patterns are formed on the wafer by repeating the above-described steps.

According to the production method of the embodiment, it is possible to easily produce a highly integrated semiconductor device, which was conventionally difficult to produce.

What is claimed is:

1. A scanning type projection exposure apparatus, comprising:

mask holding means for holding a mask with a pattern formed thereon;

wafer holding means for holding a wafer, onto which the pattern on the mask is transferred;

an illumination optical system for illuminating the mask while the mask and the wafer are being scanned, the illumination optical system comprising a slit for determining a width of an illumination area, on the mask, in the scanning direction, the slit having an area whose width does not change in the scanning direction, the slit being provided for changing the width in the scanning direction of the illumination area; and a first light detector for detecting an intensity of light extracted from the illumination optical system, wherein an exposure amount with respect to the wafer is controlled based on an output of the first light detector, and the first light detector detects the intensity of the light at a position located in correspondence with the area whose width does not change.

2. A scanning type projection exposure apparatus according to claim 1, further comprising a projection optical system for projecting the pattern onto the wafer; a second light detector for detecting the light intensity through the projection optical system; and means for storing information regarding the relationship between an output of the second light detector and the output of the first light detector.

3. A scanning type projection exposure apparatus according to claim 2, wherein the second light detector detects the light intensity of a position located in correspondence with the area whose width does not change.

4. A scanning type projection exposure apparatus according to claim 2, wherein a receiver portion of the first light detector and a receiver portion of the second light detector are conjugationally positioned.

5. A scanning type exposure apparatus according to claim 2, wherein the second light detector is provided on the wafer holding means.

6. A scanning type projection exposure apparatus according to claim 1, wherein the illumination optical system includes a half mirror for extracting the light from the illumination optical system.

7. A method of producing a device, said method comprising the steps of:

holding, with a mask stage, a mask with a pattern formed thereon;

holding, with a wafer stage, a wafer, onto which the pattern on the mask is transferred, the wafer being coated with a resist;

illuminating the mask with an illumination optical system while scanning the mask and the wafer by the mask stage and the wafer stage, the pattern being illuminated in order to transfer the pattern onto the wafer, the illumination optical system comprising a slit for detemining a width of an illumination area on the mask in the scanning direction, the slit having an area whose width does not change in the scanning direction, the slit being provided for changing the width in the scanning direction of the illumination area, excluding the area whose width does not change;

extracting light from the illumination optical system in order to detect an intensity of the light;

detecting, with the first light detector, the intensity of the light at a position located in correspondence with the area whose width does not change;

controlling an exposure amount with respect to the wafer based on an output of the first light detector, and subjecting to development the wafer with the pattern transferred thereon.

8. A method according to claim 7, further comprising projecting, with a projection optical system, the mask pattern onto the wafer.

9. A method according to claim 8, further comprising detecting, with a second light detector, the light intensity through the projection optical system.

10. A method according to claim 9, further comprising storing information regarding the relationship between an output of the second light detector and the output of the first light detector.

11. A method according to claim 9, further comprising detecting, with the second light detector, the light intensity of a position located in correspondence with the area whose width does not change.

12. A method according to claim 9, further comprising conjugationally positioning a receiver portion of the first light detector and a receiver portion of the second light detector.

13. A scanning type projection exposure apparatus, comprising:

a mask stage for holding a mask;

a wafer stage for holding a wafer, onto which a pattern of the mask is transferred;

an illumination optical system for illuminating the mask while the mask and the wafer are being scanned, the illumination optical system comprising a slit for determining a width of an illumination area, on the mask, in the scanning direction, the slit having an area whose width does not change in the scanning direction, the slit being provided for changing the width in the scanning direction of the illumination area;

a projection optical system for projecting the pattern onto the wafer;

a first light detector for detecting an intensity of light extracted from the illumination optical system; and a storage unit for storing information regarding a relationship between an output of the first light detector and an output of a second light detector which detects a light intensity through the projection optical system, wherein the exposure amount with respect to the wafer is controlled based on the information, and the first light detector detects the intensity of the light at a position located corresponding to the area whose width does not change.

14. A scanning type projection exposure apparatus according to claim 13, wherein the illumination optical system includes a half mirror for extracting the light from the illumination optical system.

15. A scanning type projection exposure apparatus according to claim 13, wherein the second light detector is provided on the wafer stage.

16. A method of producing a device, said method comprising the steps of:

holding, with a mask stage, a mask with a pattern formed thereon;

holding, with a wafer stage, a wafer, onto which the pattern on the mask is transferred, the wafer being coated with a resist;

illuminating the mask with an illumination optical system while scanning the mask and the wafer by the mask stage and the wafer stage, the pattern being illuminated in order to transfer the pattern onto the wafer, the illumination optical system comprising a slit for determining the width of an illumination area on the mask in the scanning direction, the slit having an area whose width does not change in the scanning direction, the slit being provided for changing the width in the scanning direction of the illumination area, excluding the area whose width does not change;

extracting light from the illumination optical system in order to detect an intensity of the light;

detecting, with the first light detector, the intensity of the light at a position located in correspondence with the area whose width does not change;

storing, with the storage unit, information regarding a relationship between an output of the first light detector and an output of a second light detector which detects a light intensity through the projection optical system;

controlling an exposure amount with respect to the wafer based on the relationship; and subjecting to development the wafer with the pattern transferred thereon.

* * * * *

UNITED STATES PATENT AND TRADEMARK OFFICE
CERTIFICATE OF CORRECTION

PATENT NO. : 6,657,725 B1 Page 1 of 1
DATED : December 2, 2003
INVENTOR(S) : Kazuhiro Takahashi It is certified that error appears in the above-identified patent and that said Letters Patent is hereby corrected as shown below:

<u>Title page</u>,
Item [56], References Cited, FOREIGN PATENT DOCUMENTS,
"JP 62-193125 8/1997" should read -- JP 62-193125 8/1987 --

<u>Column 3</u>,
Line 55, the first occurrence of "denotes" should be deleted.

Signed and Sealed this

Eleventh Day of May, 2004

JON W. DUDAS
*Acting Director of the United States Patent and Trademark Office*